(12) United States Patent
Jun et al.

(10) Patent No.: US 8,598,768 B2
(45) Date of Patent: Dec. 3, 2013

(54) PIEZOELECTRIC MICRO ENERGY HARVESTER AND MANUFACTURING METHOD THEREOF

(75) Inventors: Chi Hoon Jun, Daejeon (KR); Sang Choon Ko, Daejeon (KR); Jong Tae Moon, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 90 days.

(21) Appl. No.: 13/316,590

(22) Filed: Dec. 12, 2011

(65) Prior Publication Data

US 2012/0153778 A1    Jun. 21, 2012

(30) Foreign Application Priority Data

Dec. 21, 2010    (KR) .................. 10-2010-0131434

(51) Int. Cl.
*H01L 41/08* (2006.01)
(52) U.S. Cl.
USPC .......................................... 310/339; 310/365
(58) Field of Classification Search
USPC .................... 310/330–332, 365, 366, 311
See application file for complete search history.

(56) References Cited

U.S. PATENT DOCUMENTS

| 6,954,025 | B2 | 10/2005 | Nishida et al. | |
|---|---|---|---|---|
| 7,260,984 | B2 | 8/2007 | Roundy et al. | |
| 2006/0197415 | A1* | 9/2006 | Nakashio et al. | 310/365 |
| 2007/0125176 | A1* | 6/2007 | Liu | 73/649 |
| 2010/0326499 | A1* | 12/2010 | Liu | 136/252 |
| 2011/0006286 | A1* | 1/2011 | Wang et al. | 257/24 |

FOREIGN PATENT DOCUMENTS

| JP | 2005-065050 A | 3/2005 |
|---|---|---|
| KR | 2010-0049730 A | 5/2010 |

OTHER PUBLICATIONS

Marco Ferrari et al., "Piezoelectric multifrequency energy converter for power harvesting in autonomous microsystems", Sensors and Actuators A, vol. 142, pp. 329-335, Mar. 10, 2008.

* cited by examiner

Primary Examiner — Mark Budd
(74) Attorney, Agent, or Firm — Rabin & Berdo, P.C.

(57) ABSTRACT

Disclosed is a piezoelectric micro energy harvester and manufacturing method thereof, the method including: forming an insulation film on a substrate; patterning the insulation film and forming an electrode pad pattern, a center electrode pattern, and a side electrode pattern; forming an open cavity at an inside of the substrate for suspension of the center electrode pattern and the side electrode pattern; disposing a conductive film on the electrode pad pattern, the center electrode pattern, and the side electrode pattern and forming electrode pads, a center electrode, and a side electrode; and forming a piezoelectric film so as to cover a space between the center electrode and the side electrode and upper surfaces of the center electrode and the side electrode.

10 Claims, 6 Drawing Sheets

PIEZOELECTRIC MICRO ENERGY HARVESTER AND MANUFACTURING METHOD THEREOF

CROSS-REFERENCE TO RELATED APPLICATIONS

This application is based on and claims priority from Korean Patent Application No. 10-2010-0131434, filed on Dec. 21, 2010, with the Korean Intellectual Property Office, the disclosure of which is incorporated herein in its entirety by reference.

BACKGROUND OF THE INVENTION

1. Field of the invention

The present invention relates to a piezoelectric micro energy harvester which converts mechanical energy generated in a surrounding environment to electrical energy and generates power by itself, and a method of manufacturing the piezoelectric micro energy harvester. More particularly, the present invention relates to a piezoelectric micro energy harvester, which has a small-sized simple structure and uses various kinds of materials as a piezoelectric film serving as a functional film for energy conversion, and a method of manufacturing the piezoelectric micro energy harvester.

2. Description of the Prior Art

In a general sensor, it is necessary to periodically change a battery in order for the sensor to receive power from a battery mounted inside the sensor, and at this time the entire sensor itself should be detached and attached, so that there occurs a problem in maintenance costs, life of a battery, influence by a high temperature, environment pollution, etc. In this respect, the necessity of a self-powered sensor generating electrical power by itself and operating, instead of external power including a battery or power source in a home, has increased, and especially, a development of an energy harvester (or energy scavenger) capable of supplying power to a wireless sensor has been demanded.

Therefore, it is prospected that wireless sensor technology enables the sensor to be developed as a batteryless type sensor requiring no fixed battery serving as power sources. Further, the technology is applied to transportation and logistics, for example, a Tire Pressure Monitoring System (TPMS), a factory management including the motor state control, the management of a power network including smart grid, smart home and building control, environment field, and agricultural and fishery business, so that the relevant services can be more technologically enhanced.

However, the development of an energy harvester, which is a fundamental solution for operating a sensor module without power in various environments of various places, has been unfinished, and international advanced research groups are conducting research on the application of vibration, sun, wind, heat, etc. as power resources. The wireless sensor module receives necessary power from a physical quantity of such power resources so as to extend an operational time or is developed as a buried sensor type for specific usages, so that it is possible to provide more beneficial information.

Examples of places or apparatuses providing an environment including vibration all the time include a motor, a rotational device of automobile tires, etc. A wireless sensor module monitoring a state of the motor or the rotational device of the automobile tires is installed together with the energy harvester. The energy harvester converts mechanical vibration to electrical energy, so that it is possible to provide power to the wireless sensor module without an outer power supply device.

The energy harvester, which converts vibration, impact, rotational force, inertial force, pressure, fluid flow, etc. generated in a surrounding environment to electrical energy employs piezoelectric conversion, electromagnetic induction, electrostatic conversion, etc. serving as a conversion mechanism. Among the conversion mechanisms, the piezoelectric conversion is a method using a piezoelectric material as an energy conversion functional material and uses a property that when a strain of the piezoelectric material consisting of an inorganic material, such as ceramic, or an organic material, such as polymer, is changed, an electrical charge is generated. Therefore, the piezoelectric conversion method is advantageous in that the conversion method is simple, it is possible to obtain a high output voltage, and the outer voltage resources are not necessary so that a structure of the method be easily implemented.

The piezoelectric energy harvester using the aforementioned piezoelectric material includes a piezoelectric structure and electrodes and collects electric charges generated in accordance with the change of the mechanical strain applied to the piezoelectric structure by using the electrodes, so that it generates electrical energy by itself.

A conventional piezoelectric energy harvester has been usually implemented by a method in which a sintered ceramic piezoelectric material is cut in a patch shape and is then attached to a mechanical structure that is mechanically movable, or by a method in which a piezoelectric material in a form of a thick film is formed on a material having a relatively low stiffness including FR-4-based PCB (Printed Circuit Board), a polymer material, PDMS (Polydimethylsiloxane), etc. However, according to these methods, the structures in various forms are mechanically processed, arranged, and assembled, so that there is a problem of the increase of the manufacturing costs.

In the meantime, a small-sized piezoelectric micro energy harvester, which mainly uses Micro Electro Mechanical System (MEMS) technology employing a semiconductor manufacturing process, has been recently researched. However, the piezoelectric micro energy harvester uses a minimum of three or four pattern masks and a maximum of above ten pattern masks for forming of main functional elements. The piezoelectric micro energy harvester is manufactured by repeatedly performing the process steps of disposing a thin film, coating a photo resist film, and micro-patterning, and etching the thin film and then sequentially forming the functional elements in a vertical direction of a substrate. Therefore, in the event of manufacturing the piezoelectric micro energy harvester by using the conventional semiconductor manufacturing process, there is a problem of the large manufacturing costs, long manufacturing time, and the decrease of a manufacturing yield.

According to the conventional method of manufacturing most of the piezoelectric micro energy harvesters, the main functional elements, such as the electrodes and the piezoelectric film, are sequentially formed on a silicon substrate by a micromachining process of a bulk micromachining, a back surface of the silicon substrate is subjected to the micromachining process so as to form etched pits or grooves, and forming a suspended structure shaped like a cantilever separated from the substrate together with proof mass. Such a method is a process of processing front and back surfaces of a substrate, so that the process requires a large cost and is generally implemented by a wet etching using a crystalline orientation of the silicon substrate itself, so that it is impossible to optionally control a geometric form, such as a depth and a shape of a microstructure of the piezoelectric micro energy harvester, thereby resulting in the limitation of the miniaturization of the piezoelectric micro energy harvester. Further, in implementing the structure of the piezoelectric micro energy harvester by using a high-priced substrate, such as the SOI (Silicon-On-Insulator) structure, the manufacturing costs of the piezoelectric micro energy harvester further increases.

In the meantime, the piezoelectric micro energy harvester requires a functional material for energy conversion, which converts mechanical energy input from an outside environment to electrical energy, and mainly uses a piezoelectric material in the event of the piezoelectric scheme.

For example, the piezoelectric material including an inorganic material, such as ceramic including PZT (Lead Zirconate Titanate, $PbZr_xTi_{1-x}O_3$), PMN-PT [$(1-x)Pb(Mg_{1/3}Nb_{2/3})O_{3-x}PbTiO_3$], $BaTiO_3$, ZnO(Zinc Oxide), or AlN(Aluminum Nitride), metal oxide, and a semiconductor, an organic material, such as PVDF (Polyvinylidene Fluoride), and a nano material, such as nano wires or nano tubes has been researched. A conventional piezoelectric film is formed by directly micro-patterning a material of the piezoelectric film on devices by using a pattern mask during a manufacturing process of the piezoelectric micro energy harvester, or cutting a raw material in an original material state in a patch shape and then precisely aligning devices and bonding the cut material to corresponding positions of surfaces of the devices. For these methods, it is necessary to develop a unique forming process and bonding method according to each of the piezoelectric film materials to be used and the alignment equipment is required, so that the manufacturing costs is disadvantageously high. Therefore, in order to use various kinds of materials as the material of the piezoelectric film serving as the energy conversion functional film, technology for easily forming the microstructure at a specific position of surfaces of the devices is demanded.

In the meantime, mechanical vibration frequency spectrums of various bands exist in nature and it is extremely difficult to individually control the spectrums, so that the mechanical energy has to be converted to the electrical energy even in the various external mechanical frequencies in order to actually implement the piezoelectric micro energy harvester. That is, it is necessary to design the piezoelectric micro energy harvester so that the piezoelectric micro energy harvester is adequate for the broadband frequency or it is necessary to minutely analyze a characteristic of a frequency of an outside environment and design the piezoelectric micro energy harvester in detail so that the piezoelectric micro energy harvester corresponds to the analyzed frequency characteristic. However, it may be actually more ideal to design a structure of the piezoelectric micro energy harvester capable of responding to the outside broadband frequency in an aspect of the energy efficiency.

Therefore, the piezoelectric micro energy harvester having the advantages that it has a small-sized simple structure, can be simply manufactured to reduce the manufacturing costs, can be implemented in any shape, can easily use various kinds of piezoelectric film as a energy conversion functional film, and can respond to the outside broadband frequency, and a method for manufacturing the piezoelectric micro energy harvester have been demanded.

SUMMARY OF THE INVENTION

Accordingly, the present invention has been made to solve the above-mentioned problems occurring in the prior art, and the present invention provides a piezoelectric micro energy harvester having a small-sized simple structure by a semiconductor manufacturing process, and a method for manufacturing the piezoelectric micro energy harvester.

Further, the present invention provides a piezoelectric micro energy harvester capable of easily using various kinds of materials as a piezoelectric film serving as an energy conversion functional film, and a method for manufacturing the piezoelectric micro energy harvester.

Further, the present invention provides a piezoelectric micro energy harvester which can be easily mass-manufactured with the low manufacturing costs, and a method for manufacturing the piezoelectric micro energy harvester.

Further, the present invention provides a piezoelectric micro energy harvester responding to a broadband frequency of an outside environment, and a method for manufacturing the piezoelectric micro energy harvester. In accordance with an aspect of the present invention, there is provided a piezoelectric micro energy harvester including multiple piezoelectric micro energy harvester devices, each of the multiple piezoelectric micro energy harvester devices including: a substrate; an open cavity having a predetermined depth and a predetermined width and a structure of an opened upper portion, the open cavity being formed within the substrate; a first electrode pad and a second electrode pad formed on the substrate to transfer collected electrical energy to an outside; electrodes including a center electrode, a side electrode to collect generated electrical energy, the center electrode including one end connected to the first electrode pad and another end suspended on an upper portion of the open cavity, the side electrode including one end connected to the second electrode pad and another end suspended on the upper portion of the open cavity; and a piezoelectric film formed at a space between the center electrode and the side electrode and at upper surfaces of the electrodes to generate electrical energy in accordance with a change of mechanical strain.

In accordance with another aspect of the present invention, there is provided a method of manufacturing a piezoelectric micro energy harvester, the method including: forming an insulation film on a substrate; patterning the insulation film and forming an electrode pad pattern, a center electrode pattern, and a side electrode pattern; forming an open cavity at an inside of the substrate for suspension of the center electrode pattern and the side electrode pattern; disposing a conductive film on the electrode pad pattern, the center electrode pattern, and the side electrode pattern and forming electrode pads, a center electrode, and a side electrode; and forming a piezoelectric film so as to cover a space between the center electrode and the side electrode and upper surfaces of the center electrode and the side electrode.

Accordingly, the piezoelectric micro energy harvester of the present invention has a small size and a simple structure, can be formed in a microstructure having any shape, and easily form and uses various kinds of materials as the piezoelectric film serving as the energy conversion functional film.

Further, the present invention is advantageous in that it is possible to implement the piezoelectric micro energy harvester responding to bands over the broadband frequency, convert the mechanical energy generated in a surrounding environment to the electrical energy, and generate power by itself.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Hereinafter, an exemplary embodiment of the present invention will be described with reference to the accompanying drawings. The construction and the operation effects of the present invention will be clearly appreciated through the detailed descriptions below.

In describing a piezoelectric micro energy harvester according to an embodiment of the present invention, a cantilever-shaped suspended microstructure responding to a frequency of a surrounding environment is exemplified, but a basic structure of the piezoelectric micro energy harvester of the present invention is not limited to a specific form.

Figure 1:
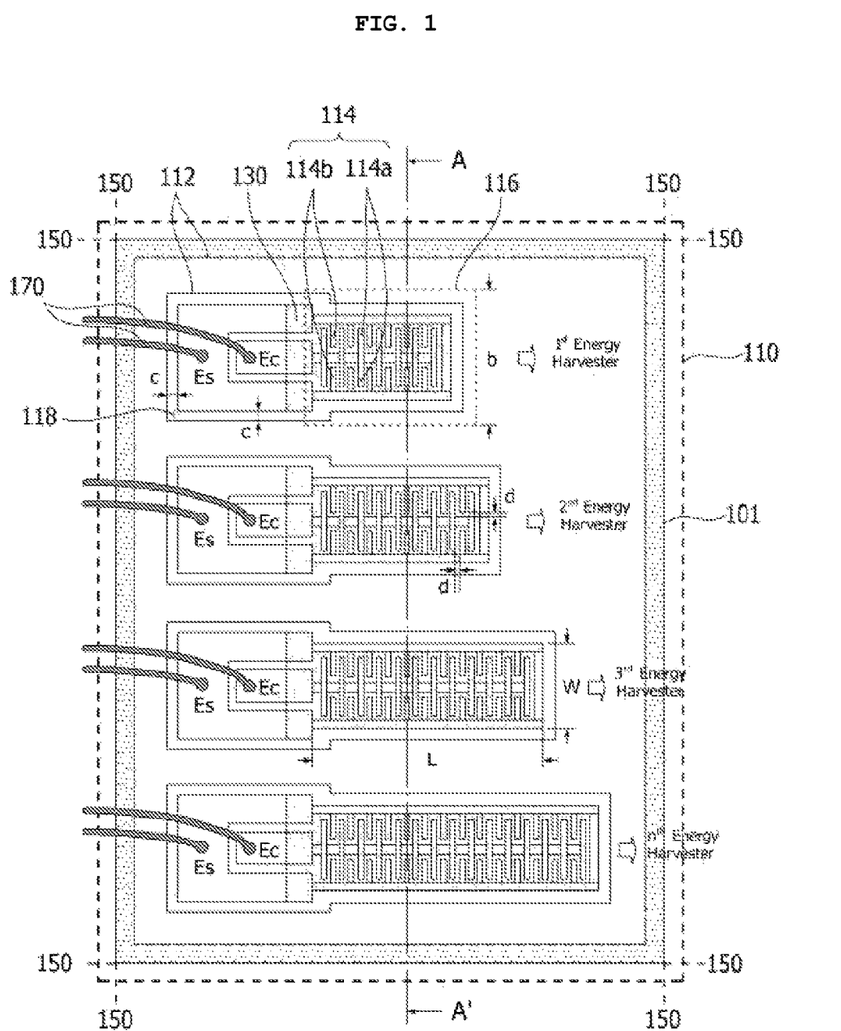
FIG. 1 is a plane view illustrating a piezoelectric micro energy harvester according to an embodiment of the present invention.
Figure 2:
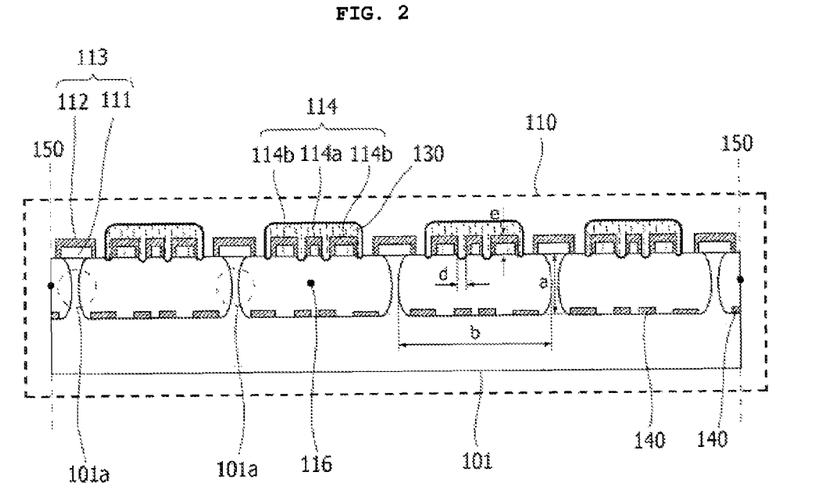
FIG. 2 is a sectional view illustrating the piezoelectric micro energy harvester of FIG. 1 taken along line AA'.

FIG. 1 is a plane view illustrating the piezoelectric micro energy harvester according to an embodiment of the present invention, and FIG. 2 is a sectional view illustrating the piezoelectric micro energy harvester of FIG. 1 taken along AA' line.

Referring to FIGS. 1 and 2, the piezoelectric micro energy harvester 110 according to the present invention generates electrical power by itself by using a surrounding environment, and includes plural open cavities 116, each of which is formed at one region of a substrate 101 and has a predetermined depth and width, plural support parts 101a for supporting structures mounted on the substrate 101, plural electrode pads Ec and Es for the transference of a electrical energy to an outside, plural electrodes 114 collecting electrical energy generated by piezoelectric films 130, and the plural piezoelectric films 130 formed between the plural electrodes 114 and at upper surfaces of the plural electrodes 114. Here, the substrate 101 is made from a semiconductor, a conductor, or an insulator, etc.

The piezoelectric micro energy harvester 110 having the above construction may include an arrangement of a plurality of devices including a first energy harvester device to an $n^{th}$ energy harvester device (where n=1, 2, 3, ..., n). Further, by adequately designing a width W and a length L of a suspended structure having a cantilever shape and being covered by the piezoelectric films 130 and proof mass of the suspended structure itself, the piezoelectric micro energy harvester 110 can control a response frequency and a response band width respect to an surrounding environment.

When a mechanical movement is generated in the piezoelectric micro energy harvester 110 by a change of the surrounding environment, the open cavities 116 allow an area incurring the movement to be separated from the substrate 101 and to freely move. The open cavity 116 has a structure of an opened upper portion, has a predetermined depth and width, and is formed within the substrate 101. Here, by adjusting the depth and width of the open cavity 116, it is possible to control a mechanical displacement (deflection) of the piezoelectric micro energy harvester 110. To this end, the open cavity 116 preferably has a depth (a) within a range from 100 to 500 µm and a width (b) of 0.5 to 10 mm.

As described above, the piezoelectric micro energy harvester 110 of the present invention includes the open cavities 116 under the electrodes 114 and the piezoelectric films 130, so that the electrodes 114 and the piezoelectric films 130 are suspended in the empty space, and thus it is possible to apply the mechanical displacement to the cantilever in accordance with the change of the surrounding environment and to apply a mechanical strain corresponding to the mechanical displacement to the piezoelectric films 130 without the limitation of the substrate 101.

The support parts 101a extend in a vertical direction from the substrate 101 and support the structures formed at the upper portion of the substrate 101.

The piezoelectric micro energy harvester 110 according to the embodiment of the present invention includes a plurality of devices from the first energy harvester device to the $n^{th}$ energy harvester device (where n=1, 2, 3, ..., n) and each of the devices includes two electrode pads Ec and Es. Here, the plurality of devices has a structure in which an insulator film 111 and a conductive film 112 are sequentially stacked, and each of the electrode pads Ec and Es is formed for the purpose of the transference of electrical energy to an outer circuit. Each of the electrode pads Ec and Es has a predetermined depth and width, and is insulated by a electrode pad separation groove 118 formed in the substrate 101 with each other, and is also insulated with the substrate 101.

The electrodes 114 has a structure in which the insulator film 111 and the conductive film 112 are sequentially stacked, and is formed at the same plane surface with the electrode pads Ec and Es, so that the electrodes 114 is suspended in an upper portion of the open cavities 116. The electrodes 114 collects electrical charges generated from the piezoelectric films 130 functioning as the energy conversion functional films which generate electrical energy in accordance with the change of the mechanical strain according to the surrounding environment.

The electrodes 114 functions as a framework of each of the microstructures suspended in each of the devices from the first energy harvester device to the $n^{th}$ energy harvester device constituting the piezoelectric micro energy harvester 110, includes a center electrode 114a extending from the electrode pad Ec and a side electrode 114b extending from the electrode pad Es, and is formed at the same plane surface with the electrode pads Ec and Es.

The center electrode 114a is electrode fingers extending from the electrode pad Ec and can be entirely shaped like a fish bone. Here, the center electrode 114a can be formed in a shape in which microelectrode fingers arranged in a micro cantilever array are attached to both side surfaces of a bridge at a center part thereof.

In this regard, the arranged micro electrode fingers make a stress gradient generated in the formation of the piezoelectric film 130 be even, so that the suspended microstructures are stably maintained.

The side electrode 114b includes two electrode fingers extending from an end of the electrode pad Es and having multiple micro cantilever arrays.

Accordingly, the center electrode 114a and the side electrode 114b form a pair of Interdigitated Electrodes (IDE) separated from each other. That is, each of the center electrode 114a and the side electrode 114b includes one or more branched micro electrode fingers arranged in a cantilever array. Further, in each of the center electrode 114a and the side electrode 114b, one end is positioned at a central part of the device to enable the center electrode 114a and the side electrode 114b to form the pair of IDEs, and the other end is connected to the electrode pad Ec or Es for the stable connection with an outer electrical conductive wire 170.

The piezoelectric micro energy harvester 110 collects electrical charges from the change of the mechanical strain of the piezoelectric film 130 generated in accordance with the outside surrounding environment by using the center electrode 114a and the side electrode 114b constituting the electrodes 114 and outputs the collected electrical charges to the outside circuit, so that it generates the electrical power by itself. Here, a micro electrode finger spacing (microelectrode spacing) (d) of the electrodes 114 is preferably set as a value within a range of 1 to 10 μm.

The piezoelectric film 130 includes an inorganic material, an organic material, a nano material, etc. Here, the piezoelectric film 130 can be formed by using a precursor in a form of a liquid or sol-gel. Therefore, if the precursor is titrated or coated in a state in which the devices are not accurately arranged, the precursor fallen to an area separated from the electrodes 114 can be dried in a state in which the precursor is not in contact with the substrate 101 and is laid between the electrode pad separation grooves 118 by surface tension. In this respect, the boundaries of edges of the electrode pads Ec and Es and the electrode 114 is set and the piezoelectric film 130 is conducted on the micro-patterned electrodes 114.

To this end, it is preferred that a width (c) of the electrode pad separation groove 118 is generally larger than the spacing (d) between the center electrode 114a and the side electrode 114b formed with the micro electrode fingers, and has a value within a range from 100 to 500 μm.

As described above, by manufacturing the piezoelectric film 130 of the piezoelectric micro energy harvester 110, a high-priced mechanical alignment system is not necessary and it is possible to prevent the generation of additional manufacturing costs.

A die separation part 150 has a predetermined depth and width for the easy separation of each of the devices and is formed in the substrate 101.

The support film 113 is formed in a combination of the insulation film 111 and the conductive film 112. Therefore, the support film 113 has an excellent durability in comparison with a single layer structure or a conventional stacked structure. Further, the support film 113 reduces the stress unevenness, decreases the stress gradient, and has a large mechanical restoration force, so that the microstructure can resist well against the outer impact.

FIGS. 3 to 8 are views sequentially illustrating a process flow of a method for manufacturing the piezoelectric micro energy harvester according to an embodiment of the present invention.

Figure 3:
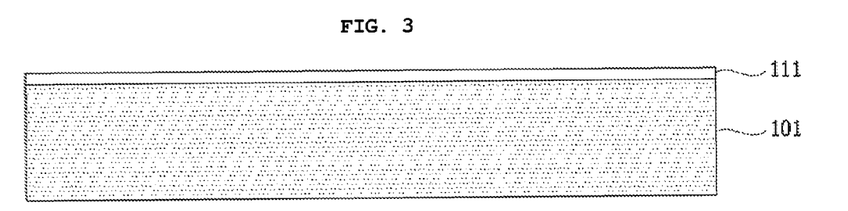
FIGS. 3 to 8 are views sequentially illustrating a process flow of a method for manufacturing a piezoelectric micro energy harvester according to an embodiment of the present invention.

As shown in FIG. 3, the insulation film 111 is formed on the substrate 101. Here, the insulation film 111 is used as an etching masking layer for forming the open cavities 116, the electrode pads Ec and Es, and the electrodes 114 in a next process. Further, the insulation film 111 electrically insulates elements so as to minimize the influence of the current flowing through the electrodes 114 and the electrode pads Ec and Es, which are to be formed in the next process, to a surrounding area, such as the substrate 101. In addition, the insulation film 111 forms a part of the support film 113 including a microstructure suspended from the substrate 101 and shaped like a fish bone and the multiple micro cantilever arrays.

The insulation film 111 can be made of a non-conductive material, such as a silicon oxide ($SiO_2$) film, a silicon nitride ($Si_3N_4$) film, a modified silicon oxide film, and a low-stress silicon nitride ($Si_XN_Y$) film. It is preferred that the insulation film 111 has a thickness within a range from 1 to 10 μm, and the insulation film 111 is formed in a single layer or multiple layers or is formed in several composite layers.

Figure 4:
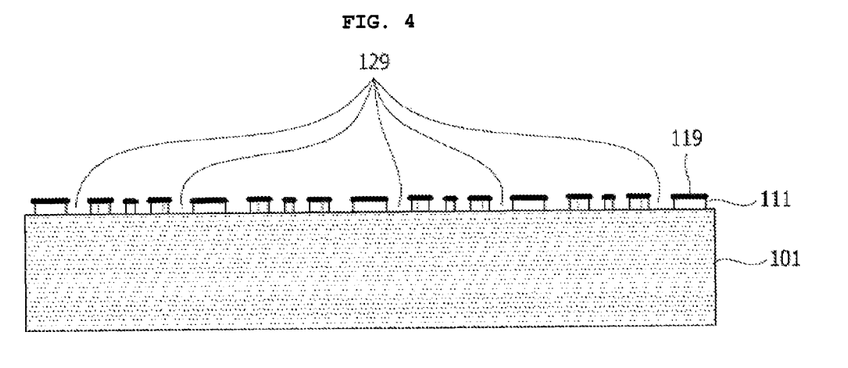

As illustrated in FIG. 4, a photoresist film 119 is coated on the insulation film 111 by using a spin coating, etc., and then the photoresist film 119 is subjected to a patterning by a lithography process and a cleaning process using a pattern mask. Here, the pattern mask includes patterns of the open cavity 116, the electrode pads Ec and Es, and the electrodes 114, the die separation part 150, the electrode pad separation grooves 118, etc. to be formed in the next process.

Then, the insulation film 111 is etched using the patterned photoresist film 119 as an etching masking layer and then micro line width portions 129 are formed in the insulation film 111 through the cleaning process.

Figure 5:
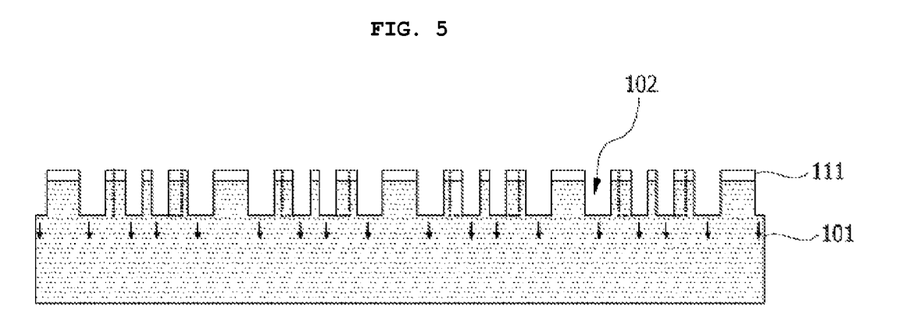

As illustrated in FIG. 5, a trench 102 is formed in the substrate 101 by using the insulation film 111 as the etching masking layer. The trench 102 is formed by asymmetrically etching the substrate 101 in a direction of an arrow shown in FIG. 5 and the etching can be performed by a Reactive Ion Etching (RIE) method or a Deep-Reactive Ion Etching (Deep-RIE) method capable of deeply etching the substrate in a vertical direction. A depth of each of the open cavity 116, the electrode pad separation groove 118, and the die separation part 150 to be formed in the next process are approximately determined according to a depth of the trench 102, and to this end, it is preferred that the trench 102 has a depth within the range from 100 to 500 μm.

Figure 6:
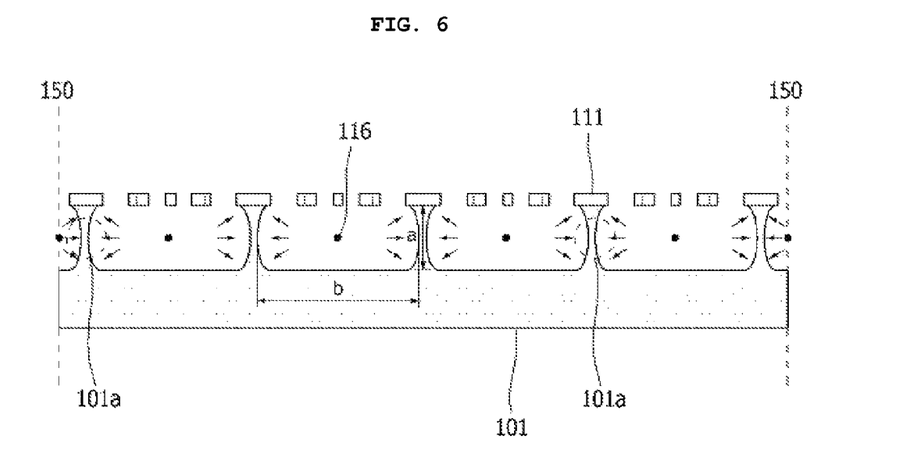

As illustrated in FIG. 6, the substrate 101 is etched in an isotropic direction of a direction of an arrow shown in FIG. 6 by using the insulation film 111 as the etching masking layer, so that the open cavity 116, the electrode pad separation groove 118, and the die separation part 150 are finally formed. At this time, the support part 101a is formed at a portion which is not etched as much as the depth of the open cavity 116, so that it supports the structures formed on the substrate 101.

Specifically, it is preferred that the open cavity 116 has the depth (a) in a range from 100 to 500 μm and the length (b) in a range from 0.5 to 10 mm.

As described above, in the present invention, the suspended structure is formed by the asymmetric and isotropic dry etching of the substrate 101, so that the present invention is advantageous in that it is possible to fundamentally prevent a sticking phenomenon between the suspended structure and the substrate which is aroused as a problem in a process of removing a sacrificial layer of the conventional piezoelectric micro energy harvester, prevent the damage generated during the manufacturing of the conventional piezoelectric micro energy harvester, and improve the manufacturing yield.

Further, as illustrated in FIG. 6, by simultaneously forming the die separation part 150 with the open cavity 116, the additional process for manufacturing the die of the piezoelectric micro energy harvester is not necessary, so that it is possible to process the substrate in an entire wafer level, and thus the present invention is advantageous in the manufacturing yield and costs.

Figure 7:
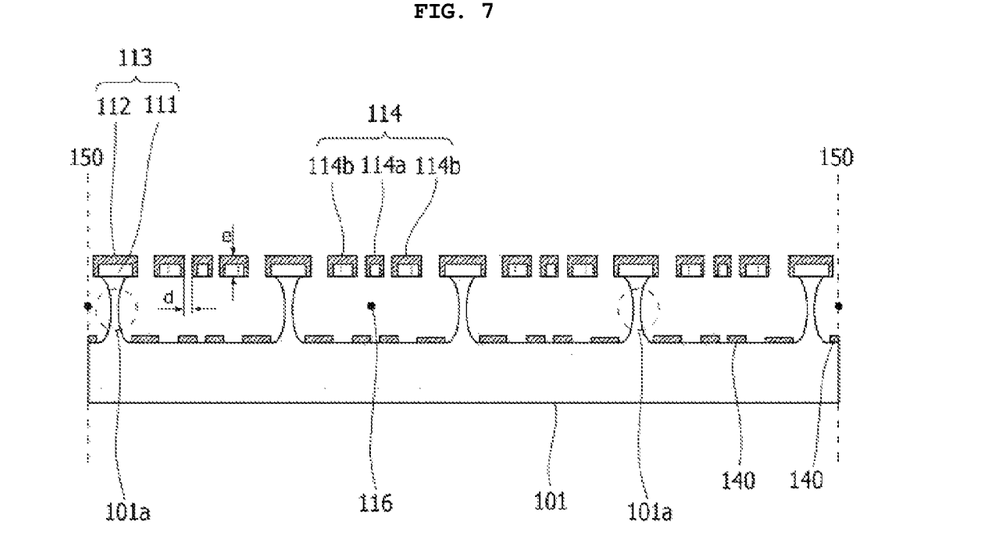

As illustrated in FIG. 7, the conductive film 112 is deposited on the insulation film 111, so that the electrodes 114 and the electrode pads Ec and Es are simultaneously formed on the same plane surface. Here, the conductive film 112 can be made of metal, a material including metal, or other conductive materials, and be formed using a sputtering, an e-Beam evaporation, or other methods. Further, the support film 113 including the insulation film 111 and the conductive film 112 is preferably formed in a thickness (e) of a range from 1 to 20 μm.

In the meantime, in forming the conductive film 112, a conduction film 140 can be partially formed under the open cavity 116, the electrode pad separation groove 118, the die separation part 150, etc., but it is electrically insulated with the structures formed on substrate 101 and suspended by the support part 101a.

As described above, in order to manufacture the functional elements of the piezoelectric micro energy harvester according to the present invention, contrary to the conventional piezoelectric micro energy harvester requiring a minimum of at least three or four pattern masks and a maximum of above ten pattern masks, it is possible to easily manufacture the piezoelectric micro energy harvester formed with the suspended microstructures in any shape and various size and depths by using only one pattern mask.

Figure 8:
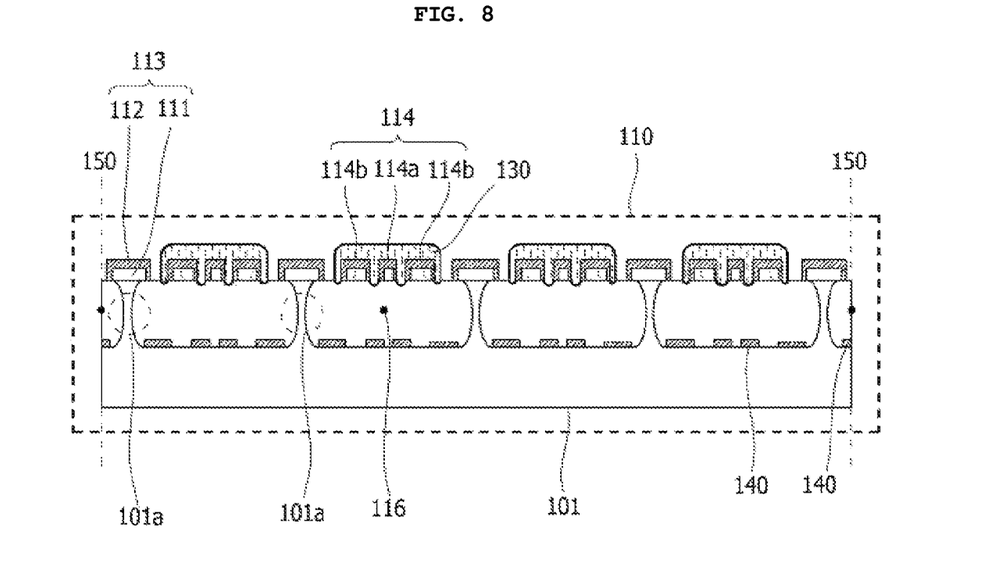

As illustrated in FIG. 8, the piezoelectric film 130 is formed on the structures suspended in the open cavity 116. Here, the piezoelectric film 130 can be formed by a screen printing, a micro-dropping, an e-beam evaporation, a sputtering, a pulsed laser deposition, a sol-gel method, a Chemical Vapor Deposition (CVD), a spray coating, a dip coating, etc., and a method of forming the piezoelectric film 130 by using a precursor in a form of a liquid or a sol-gel will be exemplarily described in the embodiment of the present invention.

First, an inorganic material, such as ceramic, an organic material, such as polymer, or a nano material, such as a nano wire, is appropriately mixed with a solvent or with a solvent and a binder, so as to prepare a precursor in a form of a liquid or a sol-gel for forming of the piezoelectric film.

Then, the precursor is titrated or coated on a portion, at which the electrodes 114 suspended above the open cavity 116 is formed, one time or several times. In four cantilever arrays including the plural electrode bodies 114 and micro electrode fingers, each of the plural electrodes 114 has a micro electrode spacing (d) within a range from 1 to 10 µm, and the support film 113 included in the electrodes 114 has a thickness (e) within a range from 1 to 20 µm.

The precursor titrated or coated on the microstructure penetrates a gap between the micro electrodes in a direction of a depth of the support film 113 by capillary force, is hung under the insulation film 111 by the surface tension, and is not contacted with the substrate 101 in the low side by the deeply formed open cavity 116. Further, a liquefied component of the precursor is gradually dried and automatically leveled in the horizontal state at a normal temperature or during the heating process, and a solid component of the precursor is filled into and remained in the gap between the micro electrodes.

Then, through an additional drying process or a post-annealing process, a remained solvent or binder component is volatilized, and only the piezoelectric film 130 is formed in a solid state. At this time, the precursor existing in a portion other than the part of the microstructures suspended by the electrode pad separation grooves 118 (refer to FIG. 1) is dried and is not in contact with the lower part of the substrate 101 by the surface tension, and the boundary is formed at an edge of the electrode pads Ec and Es and the electrodes 114.

Finally, the piezoelectric film 130 formed on the suspended microstructure is electrically connected with the micro electrode fingers of the center electrodes 114a and the side electrodes 114b. Therefore, the patterning process or the position alignment process is not necessary in the forming of the piezoelectric film 130 by the precursor. In this respect, the piezoelectric film 130 made of various kinds of materials can be directly formed at the electrodes 114 by using a principle of the capillary force and the surface tension of the precursor without being subjected to the additional process, such as the micro-patterning. Then, the piezoelectric film 130 prepared in a desired thickness is subjected to a heating process at an appropriate atmosphere, so that it is possible to improve a quality of the film and achieve the stability of the film.

As such, the electrodes 114 including the support film 113 and the piezoelectric film 130 made of the piezoelectric material is combined, so that the suspended microstructure arranged in the n number of cantilever arrays is completed. Further, when the mechanical displacement is generated in each of the microstructures according to the outside environment, the mechanical strain is changed in the piezoelectric film 130 including the cantilever array, so that the electrical energy is generated.

Then, the piezoelectric micro energy harvester 110 is segmented based on the die in the wafer level of the entire substrate 101, and the dies of the piezoelectric micro energy harvester 110 are collectively divided and subjected to the packaging in the substrate wafer by using the previously formed die separation part 150.

FIG. 1 illustrates a state in which a wire bonding of bonding electrical conductive wires 170 to the upper portions of the multiple electrode pads Ec and Es formed for connecting the center electrode 114a and the side electrode 114b with outer electrical wires in the dies of the finally divided piezoelectric micro energy harvester 110 is completed.

As described above, in the method of manufacturing the piezoelectric micro energy harvester according to the embodiment of the present invention, it is possible to once form the patterns of the main functional elements included in the piezoelectric micro energy harvester by using only one pattern mask. Therefore, the structure of the piezoelectric micro energy harvester is simple, and thus it is possible to reduce the manufacturing costs and simplify the process.

Further, by forming the suspended structure of the piezoelectric micro energy harvester with the dry etching of only a front surface of the substrate, it is possible to mass manufacture the piezoelectric micro energy harvester having any shape of the suspended structure receiving no influence by an occupation width according to a crystalline orientation of the substrate and the thickness of the substrate, the high accuracy, and a miniature size with the low manufacturing costs.

Further, as a size of the die of the piezoelectric micro energy harvester in obtaining an identical size of the cavity decreases, the total number of dies obtainable within a given diameter of the wafer increases, so that it is possible to decrease a size of the package, improve a quality by the decrease of the defect density and the drift of the process, and reduce the manufacturing costs.

Figure 9A:
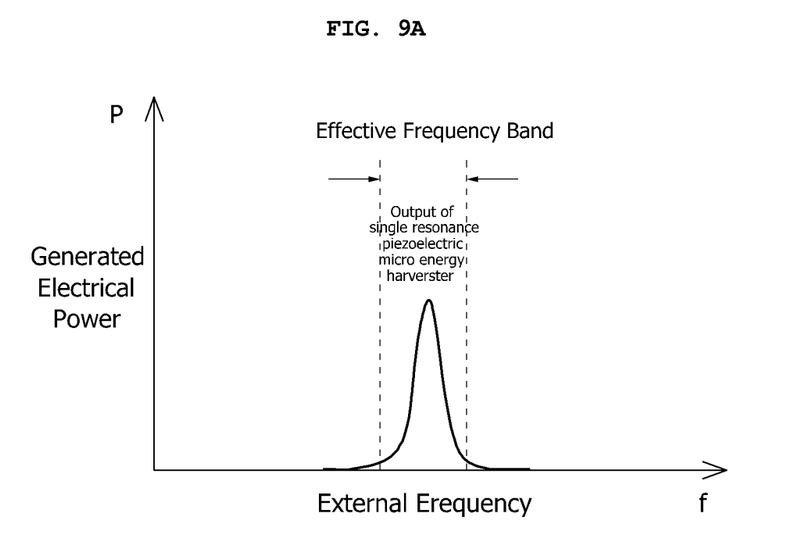
FIGS. 9A and 9B are graphs illustrating the comparison of characteristics of response to frequency between a piezoelectric micro energy harvester according to an embodiment of the present invention and a conventional piezoelectric micro energy harvester.
Figure 9B:
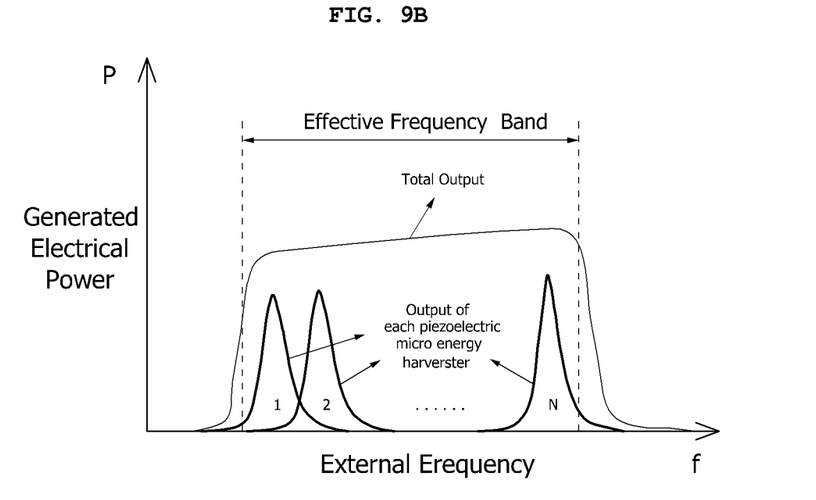

FIGS. 9A and 9B are graphs illustrating the comparison of outside frequency response characteristics between the piezoelectric micro energy harvester according to the embodiment of the present invention and the conventional piezoelectric micro energy harvester.

As illustrated in FIG. 9A, in investigating an electrical output power characteristic according to the outside frequency of the conventional piezoelectric micro energy harvester having a single resonance structure, the conventional piezoelectric micro energy harvester responds to a surrounding area of a specific resonance frequency, and when it separates from the band of the specific resonance frequency, it is impossible to efficiently perform the energy harvesting function, so that the energy conversion efficiency is very low. In order to solve the disadvantage, it is necessary to minutely analyze the outside frequency environment and to perform the frequency tuning of the energy harvester by using the proof mass, etc. in detail, which, however, has a limitation in the application in an actual environment.

Contrary to this, as illustrated in FIG. 9B, the piezoelectric micro energy harvester 110 optionally arrays the n number of devices in order that the devices have different frequency characteristics, so that it is possible to respond to the n number of basic resonance frequencies (where, n=1, 2, 3, ..., n). That is, the piezoelectric micro energy harvesters having the different resonance frequency structures are arrayed or integrated in an array group, so that it is possible to contrive the broadness by the frequency overlay, and thus it is possible to apply the energy harvester to a generic environment. Therefore, the present invention can solve the disadvantage of the conventional piezoelectric micro energy harvester having the single resonance structure and implement the piezoelectric micro energy harvester responding to the broad frequency band.

The embodiments disclosed in the specification of the present invention do not limit the present invention. The scope of the present invention should be construed on the basis of the accompanying claims in such a manner that all technologies included within the scope equivalent to the claims belong to the present invention.

What is claimed is:

1. A piezoelectric micro energy harvester comprising multiple piezoelectric micro energy harvester devices, each of the multiple piezoelectric micro energy harvester devices comprising:
    a substrate;
    an open cavity having a predetermined depth and a predetermined width and a structure of an opened upper portion, the open cavity being formed within the substrate;
    a first electrode pad and a second electrode pad formed on the substrate to transfer collected electrical energy to an outside;
    electrodes comprising a center electrode, a side electrode to collect generated electrical energy, the center electrode including one end connected to the first electrode pad and another end suspended on an upper portion of the open cavity, the side electrode including one end connected to the second electrode pad and another end suspended on the upper portion of the open cavity; and
    a piezoelectric film formed at a space between the center electrode and the side electrode and at an upper surface of the electrodes to generate electrical energy in accordance with a change of mechanical strain.

2. The piezoelectric micro energy harvester as claimed in claim 1, wherein the center electrode is shaped like a fish bone and comprises multiple micro electrode fingers arranged in a micro cantilever array and attached to both sides of a bridge structure at a center portion of the center electrode.

3. The piezoelectric micro energy harvester as claimed in claim 1, wherein the side electrode comprises multiple interconnected micro electrode fingers arranged a micro cantilever array.

4. The piezoelectric micro energy harvester as claimed in claim 1, wherein the center electrode and the side electrode face each other and form a pair of Interdigitated Electrodes (IDE).

5. The piezoelectric micro energy harvester as claimed in claim 1, wherein the piezoelectric film is made of at least one among an inorganic material, an organic material, and a nano material.

6. The piezoelectric micro energy harvester as claimed in claim 1, wherein the piezoelectric film is buried in a micro gap between the center electrode and the side electrode by capillary force and surface tension so that the center electrode and the side electrode are bridged, and covers an upper surface of the electrodes.

7. The piezoelectric micro energy harvester as claimed in claim 1, further comprising an electrode pad separation groove formed within the substrate to electrically insulate the first electrode pad and the second electrode pad and to prevent the piezoelectric film from being in contact with a lower portion of the substrate, in which a boundary of the electrode pad separation groove is formed over edges of the first electrode pad, the second electrode pad, and the electrodes.

8. The piezoelectric micro energy harvester as claimed in claim 1, wherein the first electrode pad, the second electrode pad, the center electrode, and the side electrode are made of an identical material and are formed on an identical plane surface.

9. The piezoelectric micro energy harvester as claimed in claim 8, wherein each of the first electrode pad, the second electrode pad, the center electrode, and the side electrode is formed in a structure in which an insulation and a conductive film are stacked.

10. The piezoelectric micro energy harvester as claimed in claim 1, further comprising a die separation part formed within the substrate to individually separate the devices.

* * * * *